(12) United States Patent
Jeannin et al.

(10) Patent No.: US 12,414,416 B2
(45) Date of Patent: Sep. 9, 2025

(54) OPTOELECTRONIC DEVICE WITH MICROMETRIC OR NANOMETRIC LIGHT-EMITTING DIODE ON WHICH AN OPTICAL LENS IS MOUNTED

(71) Applicant: ALEDIA, Échirolles (FR)

(72) Inventors: Olivier Jeannin, Grenoble (FR);
Frédéric Mayer, Voiron (FR)

(73) Assignee: ALEDIA, Echirolles (FR)

( * ) Notice: Subject to any disclaimer, the term of this patent is extended or adjusted under 35 U.S.C. 154(b) by 1109 days.

(21) Appl. No.: 17/418,479

(22) PCT Filed: Dec. 23, 2019

(86) PCT No.: PCT/FR2019/053290
§ 371 (c)(1),
(2) Date: Jun. 25, 2021

(87) PCT Pub. No.: WO2020/136349
PCT Pub. Date: Jul. 2, 2020

(65) Prior Publication Data
US 2022/0102598 A1      Mar. 31, 2022

(30) Foreign Application Priority Data
Dec. 28, 2018   (FR) ..................................... 18/74318

(51) Int. Cl.
*H10H 20/00*      (2025.01)
*G02B 3/00*       (2006.01)
(Continued)

(52) U.S. Cl.
CPC ............. *H10H 20/855* (2025.01); *G02B 3/00* (2013.01); *H10H 20/821* (2025.01);
(Continued)

(58) Field of Classification Search
CPC ............. H10H 20/855; H10H 20/0363; H10H 20/819; H10H 20/821; H10H 20/84;
(Continued)

(56) References Cited

U.S. PATENT DOCUMENTS

2010/0065863 A1   3/2010   Ray et al.
2011/0133060 A1   6/2011   Yu et al.
(Continued)

FOREIGN PATENT DOCUMENTS

EP   2806470 A1   11/2014
FR   3053530 A1   1/2018
(Continued)

OTHER PUBLICATIONS

International Search Report issued Apr. 9, 2020 re: Application No. PCT/FR2019/053290, pp. 1-3, citing: US 2015144873 A1, FR 3058572 A1, US 2018301594 A1, WO 2017025445 A1, US 2015129834 A1, WO 2008079078 A1, US 2011133060 A1, EP 2806470 A1 and WO 2019243743 A1.

*Primary Examiner* — Reema Patel
(74) *Attorney, Agent, or Firm* — CANTOR COLBURN LLP

(57) ABSTRACT

An optoelectronic device includes at least one light-emitting diode having a three-dimensional shape having a height along a longitudinal axis and having a first longitudinal dimension measured along the longitudinal axis and at least a second transverse dimension corresponding to a dimension of the three-dimensional shape measured perpendicular to the longitudinal axis. The first longitudinal dimension and the second transverse dimension are each less than or equal to substantially 20 µm. The optoelectronic device has at least one optical lens capable of transforming the light rays emitted by the light-emitting diode which pass through the optical lens.

18 Claims, 8 Drawing Sheets

(51) Int. Cl.
*H10H 20/821* (2025.01)
*H10H 20/841* (2025.01)
*H10H 20/855* (2025.01)
*H10H 20/01* (2025.01)

(52) U.S. Cl.
CPC ... *H10H 20/841* (2025.01); *G02B 2003/0093* (2013.01); *H10H 20/034* (2025.01); *H10H 20/0363* (2025.01)

(58) Field of Classification Search
CPC ....... H10H 20/034; H01L 33/20; H01L 33/24; H01L 33/44; H01L 33/58
See application file for complete search history.

(56) References Cited

U.S. PATENT DOCUMENTS

| | | |
|---|---|---|
| 2015/0129834 A1 | 5/2015 | Cha et al. |
| 2015/0144873 A1 | 5/2015 | Hwang et al. |
| 2018/0301594 A1 | 10/2018 | Bouvier et al. |

FOREIGN PATENT DOCUMENTS

| | | |
|---|---|---|
| FR | 3058572 A1 | 5/2018 |
| WO | 2008079078 A1 | 7/2008 |
| WO | 2017025445 A1 | 2/2017 |
| WO | 2019243743 A1 | 12/2019 |

[Fig. 1]
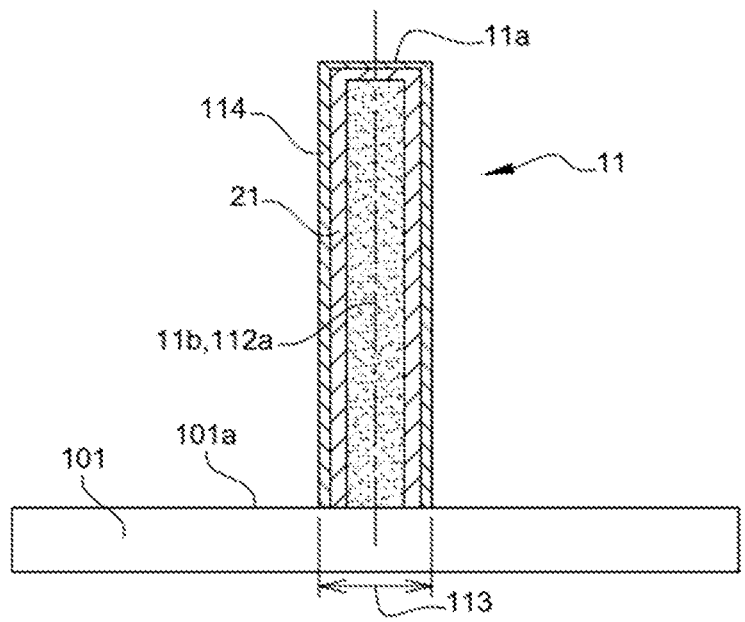
[Fig. 2]
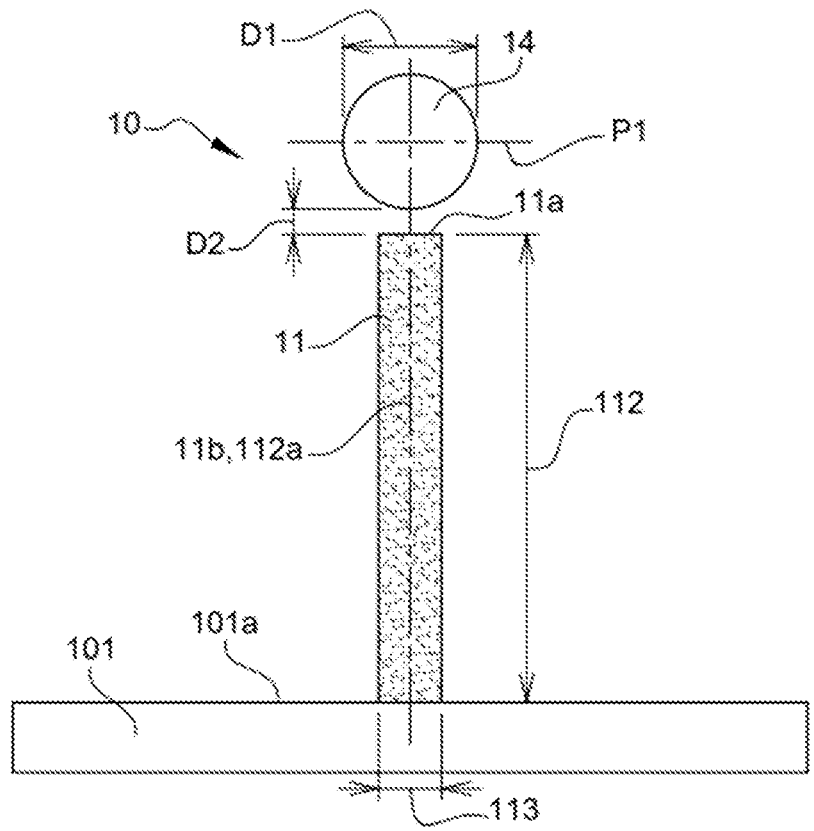

[Fig. 3]
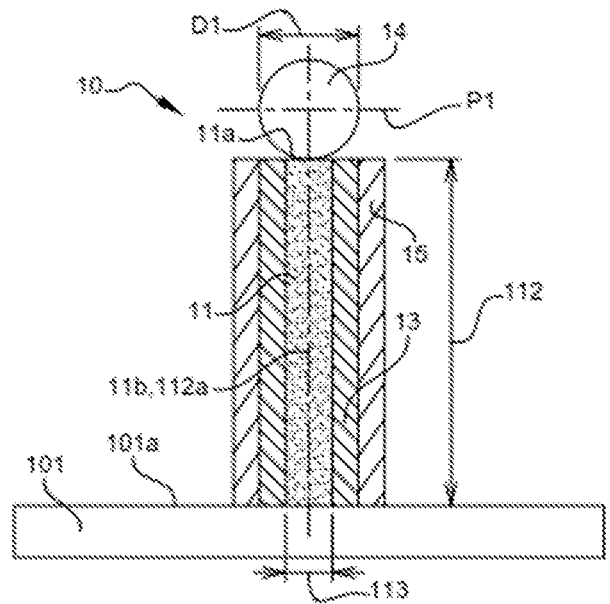
[Fig. 4]
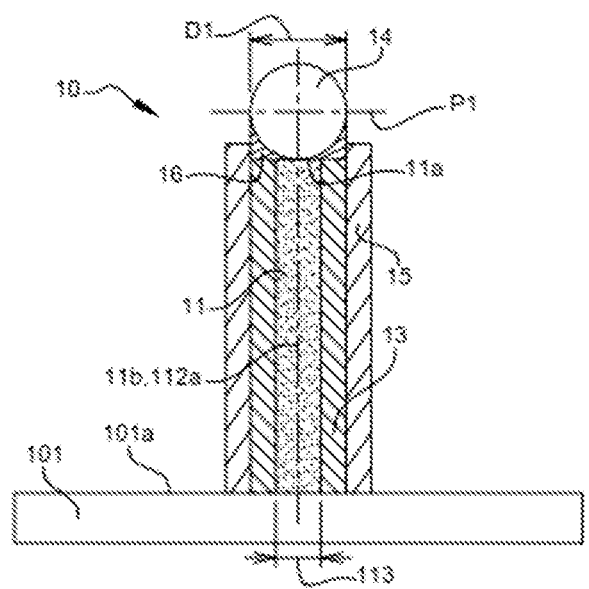

[Fig. 5]
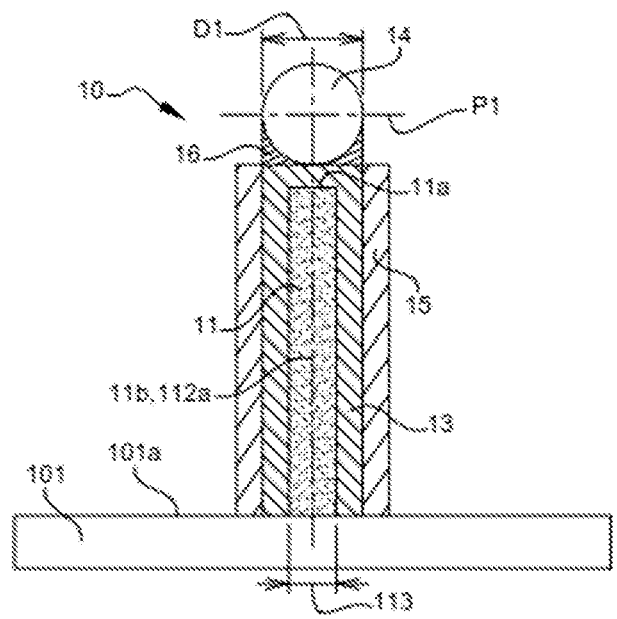
[Fig. 6]
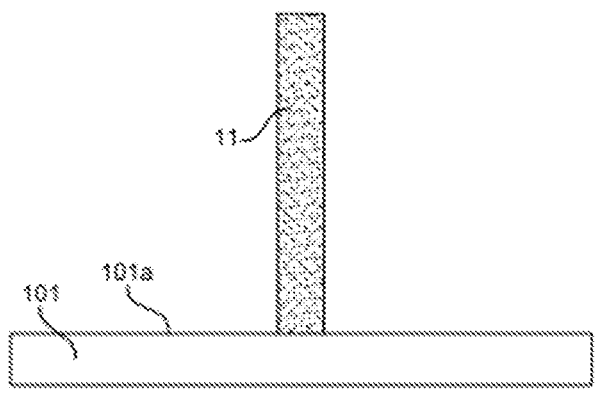

[Fig. 7]
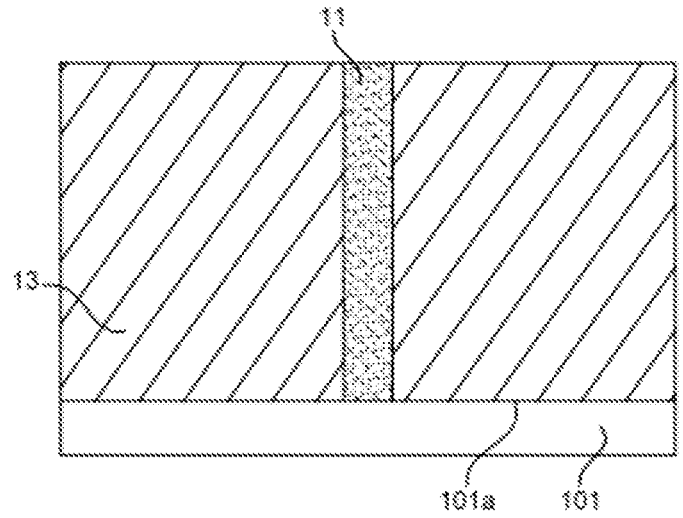
[Fig. 8]
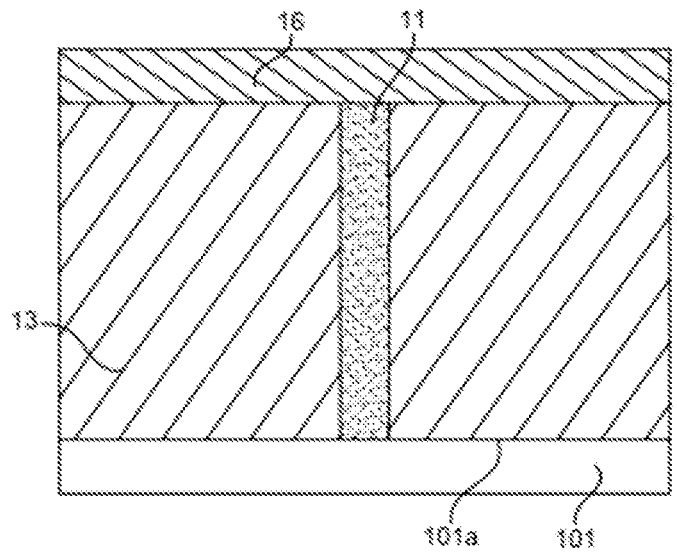

[Fig. 9]
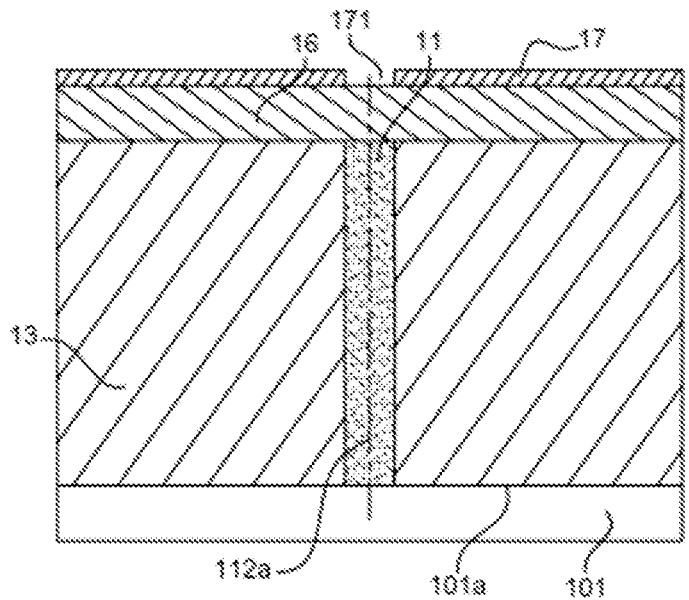
[Fig. 10]
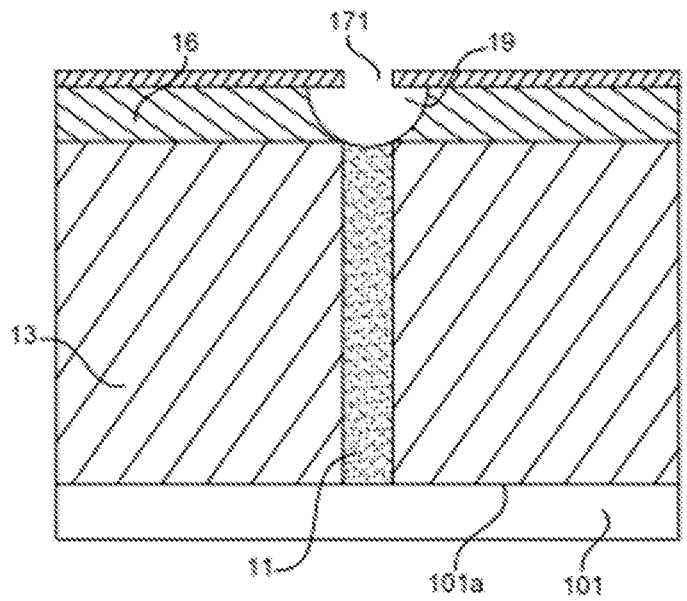

[Fig. 11]
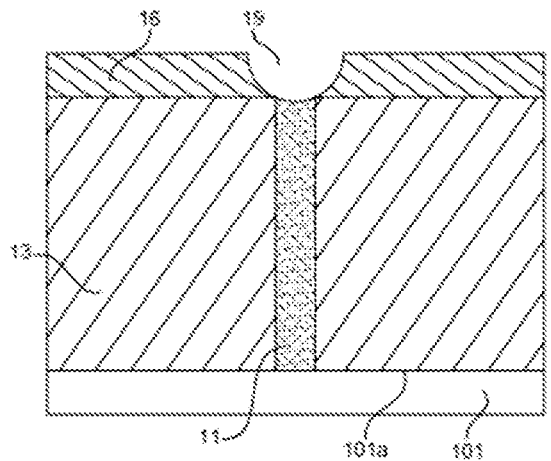
[Fig. 12]
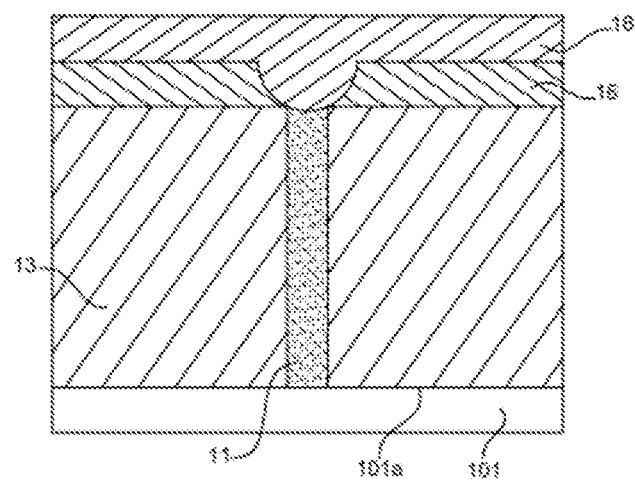

[Fig. 13]
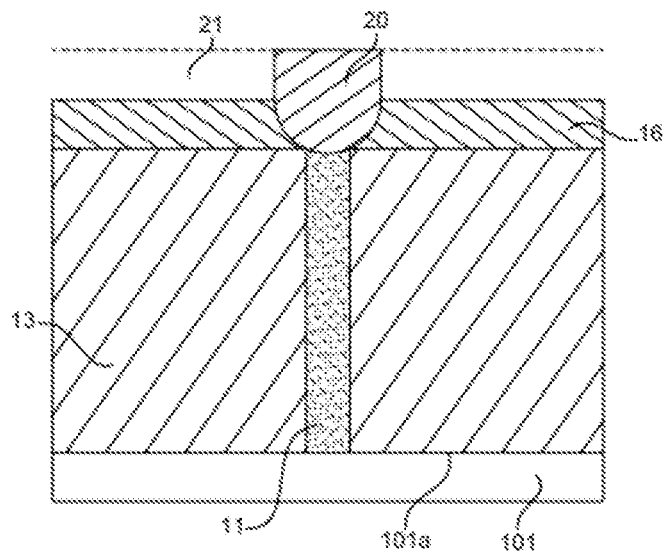
[Fig. 14]
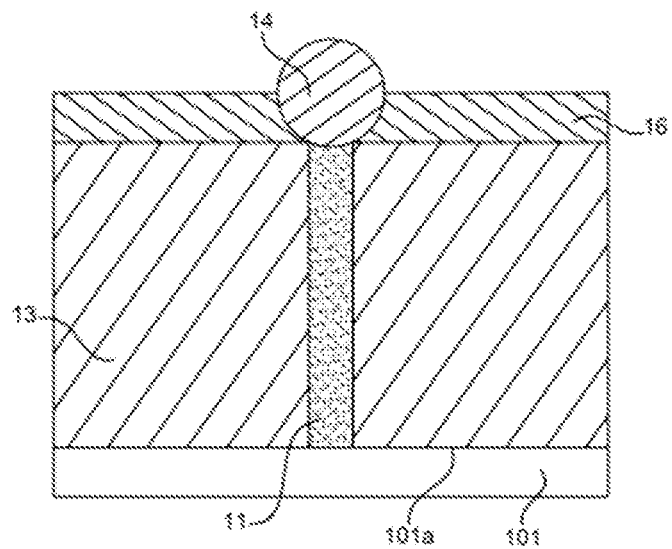

[Fig. 15]
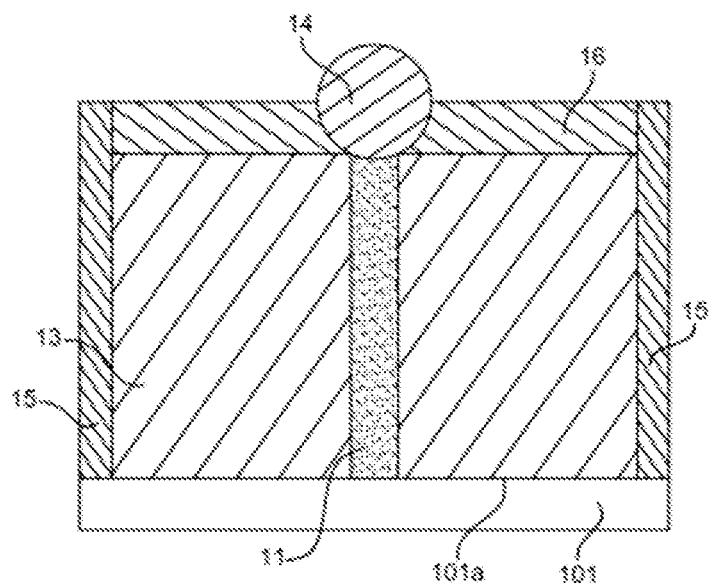

OPTOELECTRONIC DEVICE WITH MICROMETRIC OR NANOMETRIC LIGHT-EMITTING DIODE ON WHICH AN OPTICAL LENS IS MOUNTED

TECHNICAL FIELD

The present disclosure concerns an optoelectronic device including a substrate delimiting a support face and at least one light-emitting diode formed on the support face, the light-emitting diode having a three-dimensional shape including a height along a longitudinal axis extending according to a first direction directed transversely to the support face.

The disclosure also concerns a method for manufacturing an optoelectronic device.

The disclosure finds application in particular in display screens or images projection systems.

BACKGROUND

By optoelectronic device, it should be understood herein a device adapted to perform the conversion of an electrical signal into an electromagnetic radiation to be emitted, in particular light.

There are optoelectronic devices including light-emitting diodes, also known under the acronym LED, formed on a substrate.

It is known that each light-emitting diode comprises an active material exploiting quantum wells, or not, a semiconductor portion doped according to a first doping type to serve as a P-doped junction and a semiconductor portion doped according to a second doping type to serve as a N-doped junction.

Each light-emitting diode may be made based on micrometric or nanometric semiconductor three-dimensional elements, which, in turn, are at least partially obtained by epitaxial growth such as by metal organic chemical vapor deposition (MOCVD) or by molecular beam epitaxy (MBE) or by hydride vapor phase epitaxy (HYPE). Typically, the light-emitting diodes are made based on a semiconductor material comprising for example elements from the column III and from the column V of the periodic table, such as a III-V compound, in particular gallium nitride (GaN), indium and gallium nitride (InGaN) or aluminum and gallium nitride (AlGaN).

There are optoelectronic devices including an array of light-emitting diodes having a determined emission surface throughout which is transmitted the light radiation emitted by the light-emitting diodes. In particular, such optoelectronic devices may be used in the making of display screens or images projection systems, where the array of light-emitting diodes actually defines an array of light pixels where each pixel conventionally includes at least one sub-pixel for generating each color, each sub-pixel containing, in turn, at least one light-emitting diode. For example, a sub-pixel may contain up to 100000 light-emitting diodes.

One of the difficulties is that as the definition of screens increases, the dimensions between the light-emitting diodes and the dimensions of each sub-pixel become micrometric, or nanometric, and the use of three-dimensional light-emitting diodes becomes inevitable with increasingly smaller dimensions of three-dimensional light-emitting diodes. Yet, the luminous intensity emitted by the nanometric three-dimensional light-emitting diodes declines drastically as the size of the three-dimensional light-emitting diodes is reduced.

Another difficulty is how to ensure that the light radiation emitted by the three-dimensional light-emitting diodes of a determined sub-pixel does not mix with the light radiation emitted by the light-emitting diodes of an adjacent sub-pixel in order to improve the contrasts. Yet, this problem turns out to be more and more difficult given the increasing miniaturization of light-emitting diodes.

Another difficulty arises from the fact that the light emitted by a three-dimensional diode is not directional. This results in a considerable radiation loss by emission in undesirable directions, thereby causing a drop in luminous efficacy and in overall efficiency.

A known solution consists in forming light confinement walls adapted to block the transmission of the light radiation emitted by at least one determined light-emitting diode towards at least one adjacent light-emitting diode.

But this known technique does not address the need for making the light rays directional or focused and this further results in a partial loss of the light radiation by absorption through the light confinement walls, making the luminous efficacy and the overall efficiency drop.

SUMMARY

The present disclosure aims to address all or part of the problems set out hereinbefore.

In particular, to the disclosure provides a solution addressing at least one of the following objectives:
 focus or make the light rays emitted by a three-dimensional light-emitting diode as much directional as possible;
 increase the luminous efficacy of the optoelectronic device;
 allow obtaining the highest possible luminous intensity emitted by a three-dimensional light-emitting diode.

This advantage can be achieved by the provision of an optoelectronic device including a substrate delimiting a support face and at least one light-emitting diode formed on the support face, said at least one light-emitting diode having a three-dimensional shape comprising a height according to a longitudinal axis extending according to a first direction directed transversely to the support face and having a first longitudinal dimension considered according to the longitudinal axis between a proximal portion of the light-emitting diode directed towards the support face and a distal portion of the light-emitting diode opposite, along the first direction, to said proximal portion, and at least one second transverse dimension corresponding to a dimension of said three-dimensional shape considered perpendicularly to the longitudinal axis, wherein each of the first longitudinal dimension and the second transverse dimension is smaller than or equal to about 20 µm, the optoelectronic device includes at least one optical lens adapted to transform the light rays emitted by the light-emitting diode that cross said optical lens, formed above the distal portion of the light-emitting diode according to the first direction in a manner generally axially aligned with the longitudinal axis of the light-emitting diode and having an outer surface adapted to be crossed by at least one portion of said light rays having a convex shape.

Some preferred, yet non-limiting, aspects of the device are as follows.

The convex shape of the outer surface of the optical lens is in the form of a surface of revolution whose axis of revolution is substantially aligned with the longitudinal axis of the light-emitting diode and whose generatrix is an arcuate segment.

The surface of revolution has a section, viewed in any sectional plane including the axis of revolution, shaped like a horseshoe arch.

The surface of revolution is shaped so that the surface area of the section of the outer surface in a section perpendicularly to its axis of revolution has a maximum value at the level of a main plane substantially parallel to the support face where the section has a maximum diameter larger than or equal to the second transverse dimension of the light-emitting diode above which the optical lens having said maximum diameter is formed.

The surface of revolution is shaped so that the surface area of the section of the outer surface in a section perpendicularly to its axis of revolution has a maximum value at the level of a main plane substantially parallel to the support face where the section has a maximum diameter larger than or equal to the second transverse dimension of the light-emitting diode above which the optical lens having said maximum diameter is formed.

The maximum diameter is comprised between 0.1 µm and 20 µm.

The optical lens is made of a material having an optical index comprised between 1.4 and 2.2.

On the side opposite to the distal portion of the light-emitting diode according to the first direction, the optical lens is truncated according to a plane substantially parallel to the support face.

At least one portion of the light-emitting diode comprises a passivation layer.

The optical lens and the distal portion of the light-emitting diode are in mechanical contact.

At least one portion of the optical lens and the distal portion of the light-emitting diode are separated from one another with the interposition of a distance comprised between 5 nm and 20 µm.

An optical material, with an optical index comprised between 1.4 and 2.2 and lower than or equal to an optical index of the optical lens, fills all or part of the space comprised between the distal portion of the light-emitting diode and the portion of the optical lens turned towards the distal portion of the light-emitting diode.

All or part of the light-emitting diode is surrounded by an encapsulation material.

When viewed perpendicularly to the longitudinal axis, the encapsulation material is surrounded by at least one wall adapted to reflect the light rays emitted by the light-emitting diode.

The disclosure also covers the implementation of a method for manufacturing an optoelectronic device, the method comprising the following steps:

a) formation of a substrate delimiting a support face;
b) formation of at least one light-emitting diode having a three-dimensional shape comprising a height according to a longitudinal axis extending according to a first direction directed transversely to the support face and having a first longitudinal dimension considered according to the longitudinal axis between a proximal portion of the light-emitting diode directed towards the support face and a distal portion of the light-emitting diode opposite, along the first direction, to said proximal portion, and at least one second transverse dimension corresponding to a dimension of said three-dimensional shape considered perpendicularly to the longitudinal axis, wherein each of the first longitudinal dimension and the second transverse dimension is smaller than or equal to substantially 20 µm;
i) formation of at least one optical lens above the distal portion of the light-emitting diode according to the first direction so that the optical lens is generally axially aligned with the longitudinal axis of the light-emitting diode, the formed optical lens being adapted to transform the light rays emitted by the light-emitting diode that cross the optical lens and having an outer surface adapted to be crossed by said light rays having a convex shape.

Some preferred, yet non-limiting, aspects of the method are as follows.

The manufacturing method comprises the following steps, implemented between step b) and step i):

c) formation of an encapsulation material surrounding all or part of the light-emitting diode;
d) formation, over the exposed face of the intermediate structure obtained at step c), of a first layer of an optical material, with an optical index comprised between 1.4 and 2.2 and lower than or equal to an optical index of the optical lens, said first optical material layer being adapted to be etched isotropically through the implementation of a first etching method;
e) formation, over the free surface of the intermediate structure obtained after step d), of a hard mask layer adapted to not be etched during the use of the first etching method;
f) etching of a first opening, through the implementation of a second etching method, through the hard mask layer obtained at step e), the first opening corresponding to a section of the light-emitting diode according to a plane parallel to the support face, said first opening of the hard mask layer being located above the light-emitting diode in the continuation of the longitudinal axis;
g) etching of at least one cavity, through the implementation of the first etching method at the level of the first opening obtained at step f), across all or part of the thickness of the first optical material layer, the cavity obtained in this manner having a concave shape complementary to the convex surface of the optical lens and being suited for the subsequent formation of the optical lens at step i) directly in the cavity;
h) removal of the hard mask layer.

Step i) may comprise the following steps:

i1) formation of a polymer layer over the exposed surface of the intermediate structure obtained after step h), the polymer layer filling all or part of the cavity;
i2) etching of the polymer layer located at the level of at least one portion to be removed, allowing preserving at least one residual portion of the polymer layer located right above the light-emitting diode in the continuation of the longitudinal axis;
i3) annealing of said at least one residual portion, annealing being carried out in conditions allowing making the polymer constituting said at least one residual portion pass through a viscous state.

The manufacturing method may include a step j) of forming at least one wall adapted to reflect the light radiations emitted by the light-emitting diode, the wall extending from the support face substantially parallel to the longitudinal axis.

BRIEF DESCRIPTION OF THE DRAWINGS

Other aspects, objects, advantages and features of the disclosure will appear better on reading the following detailed description of preferred embodiments thereof, provided as a non-limiting example, and made with reference to the appended drawings in which:

FIG. 1 represents a schematic cross-section of a light-emitting diode adapted to be used in the disclosure;

FIG. 2 represents a schematic cross-section of a first embodiment of an optoelectronic device according to the disclosure containing a light-emitting diode;

FIG. 3 illustrates a schematic cross-section of a second embodiment of an optoelectronic device according to the disclosure containing a light-emitting diode;

FIG. 4 represents a schematic cross-section of a third embodiment of an optoelectronic device according to the disclosure containing a light-emitting diode;

FIG. 5 illustrates a schematic cross-section of a fourth embodiment of an optoelectronic device according to the disclosure containing a light-emitting diode;

FIG. 6 represents, in a schematic cross-section, a first step of a first example of a method for manufacturing an optoelectronic device according to the disclosure;

FIG. 7 represents, in a schematic cross-section, a second step of the first example of the manufacturing method;

FIG. 8 represents, in a schematic cross-section, a third step of the first example of the manufacturing method;

FIG. 9 represents, in a schematic cross-section, a fourth step of the first example of the manufacturing method;

FIG. 10 represents, in a schematic cross-section, a fifth step of the first example of the manufacturing method;

FIG. 11 represents, in a schematic cross-section, a sixth step of the first example of the manufacturing method;

FIG. 12 represents, in a schematic cross-section, a first step of a second example of a method for manufacturing an optoelectronic device according to the disclosure;

FIG. 13 represents, in a schematic cross-section, a second step of the second example of the manufacturing method;

FIG. 14 represents, in a schematic cross-section, a seventh step of the first example of the manufacturing method; and FIG. 15 represents, in a schematic cross-section, a step of a third example of a method for manufacturing an optoelectronic device according to the disclosure.

DETAILED DESCRIPTION OF THE DRAWINGS

In FIGS. 1 to 15 and in the following description, the same reference numerals represent identical or similar elements. In addition, the different elements are not represented to scale so as to enhance clarity of the figures to facilitate understanding thereof. Moreover, the different embodiments and variants do not exclude one another and may be combined together.

In the following description, unless indicated otherwise, the terms «substantially», «about», «generally» and «in the range of» mean «within 10%».

For exclusively illustrative purposes, but without limitation, each of FIGS. 2 to 15 represents an optoelectronic device 10 comprising only one light-emitting diode 11, that being so for merely illustrative purposes. Indeed, the number of light-emitting diodes 11 is not restrictive per se.

The disclosure firstly covers an optoelectronic device 10, including at least one three-dimensional light-emitting diode 11, having micrometric or nanometric dimensions, and whose emitted light rays are focused or made as much directional as possible thanks to the presence of at least one optical lens 14, an arrangement thereof as well as a method for forming it being described later on.

The disclosure also covers a method for manufacturing an optoelectronic device 10.

Thanks to the arrangement of three-dimensional light-emitting diodes 11 associated to a micrometric or nanometric optical lens 14, a particularly targeted application is the provision of an image display screen or in an image projection device.

It is also clear that the embodiments described in this document could find applications in other fields, for example the detection or measurement of electromagnetic radiations or in photovoltaic applications.

The optoelectronic device 10 comprises a substrate 101, having a support face 101a, which is an element common to the different embodiments. The nature of the substrate 101 may be any one and does not brings any limitation herein, any known substrate 101 suited for the implementation of what will be described later on could be considered.

For example, the substrate 101 is constituted by a stacking of a monolithic layer (not represented), a lower electrode layer (not represented) which may be a conductive seed layer and a first electrical insulation layer (not represented). Those skilled in the art could refer, for example to the patent application FR-A1-3053530 for the formation and provision of such a substrate For example, the support face 101a of the substrate 101 is constituted by the exposed face of the aforementioned first electrical insulation layer.

The monolithic layer may be formed in a semiconductor material, whether doped or not, for example silicon or germanium, and more particularly monocrystalline silicon.

It may also be formed by sapphire and even by a III-V semiconductor material, for example GaN. Alternatively, it may comprise a «Silicon On Insulator» or «SOI» type substrate. Alternatively, the monolithic layer may be formed in an electrically-insulating material.

The lower electrode layer is intended to form one or several first lower electrode(s) and may serve as a seed layer for the growth of portions of light-emitting diodes 11. The lower electrode layer may be continuous or discontinuous. The material composing the lower electrode layer may comprise a nitride, a carbide or a boride of a transition metal from the column IV, V or VI of the periodic table of elements or a combination of these compounds.

The first electrical insulation layer may comprise a first intermediate electrically-insulating layer which covers the lower electrode layer. Besides its electrical insulation properties, it forms a growth mask enabling the growth, for example epitaxial, of doped portions of the light-emitting diodes 11 from through openings delimited by this growth mask locally opening onto the lower electrode layer. The first electrical insulation layer is also involved in ensuring the electrical insulation between the first lower electrodes (not represented) and the second electrodes 21 (shown in FIG. 1). The first intermediate insulating layer is made of at least one dielectric material such as, for example, a silicon oxide (for example $SiO_2$ or SiON) or a silicon nitride (for example $Si_3Na$ or SiN), or a silicon oxynitride, an aluminum oxide (for example $Al_2O_3$) or a hafnium oxide (for example $HfO_2$). The thickness of the first intermediate insulating layer may be comprised between 5 nm and 1 μm, preferably comprised between 20 nm and 500 nm, for example equal to about 100 nm.

The first electrical insulation layer may include, in addition to the first intermediate insulating layer, a second intermediate insulating layer (not represented) which covers the first lower electrodes and participates in ensuring the electrical insulation between the first lower electrodes and the second upper electrodes 21. The second intermediate electrically-insulating layer may also cover the growth mask formed by the first intermediate insulating layer. The second intermediate insulating layer may be made of a dielectric material identical to or different from that one of the growth mask, such as, for example, a silicon oxide (for example $SiO_2$) or a silicon nitride (for example $Si_3Na$ or SiN), or a silicon oxynitride, an aluminum oxide (for example $Al_2O_3$) or a hafnium oxide (for example $HfO_2$). The thickness of the first intermediate insulating layer may be comprised between 5 nm and 1 µm, preferably comprised between 20 nm and 500 nm, for example equal to about 100 nm.

At least one light-emitting diode 11 having a three-dimensional shape comprising a height according to a longitudinal axis 11b is formed on the support face 101a of the substrate 101. This longitudinal axis 11b extends according to a first direction 112a directed transversely to the support face 101a of the substrate 101. In particular, the first direction 112a is substantially perpendicular to the general plane in which the substrate 101 extends.

Thus, each light-emitting diode 11 includes a proximal portion directed towards the support face 101a of the substrate 101 and, opposite thereto along the first direction 112a, a distal portion 11a opposite to the proximal portion. In particular, the proximal portion of each light-emitting diode 11 is formed on the support face 101a of the substrate, with the provision of an electrical contact with the lower electrode layer. The light-emitting diodes 11 are characterized by a so-called longitudinal first dimension, denoted 112, measured along the longitudinal axis 11b between the distal portion 11a and the proximal portion of the light-emitting diode 11. The light-emitting diodes 11 are also characterized by a so-called transverse second dimension, denoted 113, corresponding to a dimension considered perpendicularly to the longitudinal axis 11b, in particular corresponding to the largest dimension of the section of the light-emitting diode 11 considered in any sectional plane directed perpendicularly to the longitudinal axis 11b. In the case where the dimensions of the section evolve along the height of the light-emitting diode 11, the second transverse dimension considered in this document corresponds to the largest one of the values taken by the largest dimension of all sections over the entire height. The three-dimensional shape taken by each light-emitting diode 11, with nanometric or micrometric dimensions, may have generally cylindrical wire-like shape, a cone or a cone frustum, or a generally pyramidal shape whereas the section, whether regular or not along the longitudinal axis 11b both in its shape as well as in its dimensions, could be circular or not, for example oval or polygonal (for example square, rectangular, triangular, hexagonal). The second transverse dimension 113, also called minor dimension, which generally corresponds to a thickness of the diode 11 transversely to the first direction 112a, is preferably comprised between 5 nm and 20 µm, preferably between 50 nm and 5 µm. The ratio between the first longitudinal dimension 112, also called major dimension, and the second transverse dimension 113, is greater than or equal to 1, preferably greater than or equal to 5, and even more preferably greater than or equal to 10. In some embodiments, the second transverse dimension 113 may be smaller than or equal to about 1 µm, preferably comprised between 100 nm and 1 µm, more preferably between 100 nm and 800 nm. In some embodiments, the first longitudinal dimension 112, which generally corresponds to the height of the light-emitting diode 11 according to the first direction 112a, is larger than or equal to 50 nm, preferably comprised between 50 nm and 50 µm, more preferably between 1 µm and 20 µm.

In particular, the disclosure concerns an optoelectronic device 10 wherein both of the first longitudinal dimension 112 and the second transverse dimension 113 of the light-emitting diodes 11 are smaller than or equal to 20 µm.

In general, each light-emitting diode 11 comprises semiconductor elements including a first portion doped according to a first doping type to serve as a P-doped junction, a second portion forming an active portion and a third portion doped according to a second doping type to serve as a N-doped junction. The semiconductor elements of the light-emitting diodes 11 have a three-dimensional shape, which includes the wired shape, the conical or frustoconical shape or the pyramidal shape.

In the description and in the figures, the embodiments are described for the non-limiting particular case where the three-dimensional light-emitting diodes 11 are in the form of a cylindrical wire whose section is any one, for example circular.

In general, each light-emitting diode 11 is electrically connected to the first lower electrode which is formed in the substrate 101.

As example, the light-emitting diodes 11 may be made, at least partially, of semiconductor materials from the group IV such as silicon or germanium or mostly including a III-V compound, for example III-N compounds. Examples from the group III comprise gallium, indium or aluminum. Examples of III-N compounds are GaN, AlN, InGaN or AlInGaN. Other elements from the group V may also be used, for example, phosphorus, arsenic or antimony. In general, the elements in the III-V compound may be combined with different molar fractions. It should be set out that the light-emitting diodes 11 may indifferently be formed from semiconductor materials including mostly a II-VI compound. The dopant may be selected, in the case of a III-V compound, from the group comprising a P-type dopant from the group II, for example magnesium, zinc, cadmium or mercury, a P-type dopant from the group IV for example carbon, or a N-type dopant from the group IV, for example silicon, germanium, selenium, sulfur, terbium or tin.

The active portion of the light-emitting diodes 11 corresponds to the layer from which most of the light rays output by the light-emitting diodes 11 is emitted. It may include means for confining the electric charge carriers, such as quantum wells. For example, it is constituted by an alternation of GaN and InGaN layers. The GaN layers may be doped or not. Alternatively, the active portion is constituted by one single InGaN layer.

In general, the light-emitting diodes 11 may be obtained by any technique of a person skilled in the art such as for example: a chemical vapor deposition called «CVD», an atomic layer deposition called «ALD», or a physical vapor deposition called «PVD» or by molecular beam epitaxy «MBE» or by metal organic vapor phase epitaxy «MOVPE» or by metal organic chemical vapor deposition «MOCVD».

As example, each light-emitting diode 11 is electrically connected to the second upper electrode 21 represented in FIG. 1. The second upper electrode 21 covers at least partially the light-emitting diode 11 so that when a voltage is applied between the first lower electrode and the second upper electrode 21, light rays are emitted from the active portion of the light-emitting diode 11. Preferably, the second upper electrode 21 is transparent to these light rays. For example, it may be formed by a transparent conductive oxide «TCO» such as an indium oxide doped with tin («ITO» standing for «Indium Tin Oxide») or a zinc oxide doped for example with aluminum. A person skilled in the art can use any known technique to implement this second upper electrode 21. The second upper electrode 21 may extend beyond the walls of the light-emitting diode 11, in particular substantially parallel to the support face 101a. In a non-limiting particular example, the second upper electrode 21 may be covered at least partially with a metal to improve conductivity. A person skilled in the art can use any known technique to achieve a contact recovery on the second upper electrode 21 from outside the optoelectronic device 10.

The light-emitting diodes 11 may also be wrapped at least partially with a passivation layer 114, as illustrated in FIG. 1. The passivation layer 114 may be made of an at least partially transparent electrically-insulating material. For example, the passivation layer 114 is made of SiN or SiON. Preferably, the maximum thickness of the passivation layer 114 is comprised between 250 nm and 50 µm and preferably with a thickness of about 1 µm.

In FIG. 1, the light-emitting diode 11 is covered by the second upper electrode 21, covered, in turn, by the passivation layer 114. For clarity, in FIGS. 2 to 15, the light-emitting diode 11 is represented without the passivation layers 114 and without the second upper electrode 21. However, the light-emitting diode 11 used in FIGS. 2 to 15 may indifferently be replaced with that one represented in FIG. 1 which is covered by the passivation layer 114 and by the second upper electrode 21. Similarly, the distal portion 11a of the light-emitting diode 11 may be covered, or not, by the second upper electrode 21 and by the passivation layer 114. Thus, the second transverse dimension 113 may correspond to the transverse dimension of the light-emitting diode 11 with the presence of the second upper electrode 21 and of the passivation layer 114.

As illustrated in FIG. 2, according to a major feature, the optoelectronic device 10 comprises at least one optical lens 14 formed on top of the light-emitting diode 11 according to the first direction 112a. The optical lens 14 is formed on the distal portion 11a of the light-emitting diode 11 while being generally axially aligned with the longitudinal axis 11b of the light-emitting diode 11. By «formed on top of», it should be understood that the optical lens 14 is either in mechanical contact with the distal portion 11a of the light-emitting diode 11, or located at a distance shorter than 20 µm with respect to the distal portion 11a of the light-emitting diode 11 with the interposition of an intermediate material, or not.

By «generally aligned» or «generally axially aligned», it should be herein understood that either the optical axis of the optical lens 14 is collinear within 20 µm with the longitudinal axis 11b of the light-emitting diode 11, or the optical axis of the optical lens 14 is aligned within a 10° angle with respect to the longitudinal axis 11b of the light-emitting diode 11.

The optical lens 14, which is intended to be crossed by all or part of the light rays emitted by the light-emitting diode 11 in order to transform them as will be described later on, has an outer surface adapted to be crossed by these light rays originating from the light-emitting diode 11 having a convex shape.

In particular, the optical lens 14 may be shaped so that the convex shape of its outer surface is in the form of a surface of revolution whose axis of revolution is substantially aligned with the longitudinal axis 11b of the diode 11 and whose generatrix is an arcuate segment, for example a circle arc. The axis of revolution then materializes the optical axis of the optical lens 14. By «substantially aligned», it should be understood herein that either the axis of revolution of the surface of revolution is collinear within 20 µm with the longitudinal axis 11b of the light-emitting diode 11, or the axis of revolution of the surface of revolution is aligned within a 10° angle with respect to the longitudinal axis 11b of the light-emitting diode 11. It should be recalled that, by mathematical definition, a surface of revolution corresponds to the spatial surface generated by the 360° rotation of the aforementioned generatrix about the axis of revolution.

As example, the surface of revolution has a section, viewed in any sectional plane including the axis of revolution, shaped like a horseshoe arch. This means that the generatrix is then a circle arc covering an angular sector strictly wider than 180°. It goes without saying that while being advantageous for optimizing optical efficiency, this feature is not restrictive.

For example, the optical lens 11 may have a portion truncated according to a plane substantially parallel to the support face 101a. In one example, the truncated portion of the optical lens 14 is located on the side opposite to the portion of the optical lens 14 located opposite the distal portion 11a of the light-emitting diode 11.

Advantageously, the optical lens 14 is made of a material with an optical index comprised between 1.4 and 2.2, and more preferably between 1.4 and 1.6.

The lens 14 may be made of borosilicate, glass, silica $SiO_2$, $Al_2O_3$, sapphire, polymer, thermoformable polymer, photosensitive resin, plastic, or of a liquid.

Preferably, the optical lens 14 has a shape comprising, totally or partially, of a generally spherical shape, that is to say the shape of all or part of a sphere. By «generally spherical», it should be understood that the diameter of the optical lens 14 considered in any direction varies by less than 10%. Advantageously, this shape allows collecting a maximum of light rays originating from the light-emitting diode 11 thanks to a reduced focal distance.

The optical lens 14 and the distal portion 11a of the light-emitting diode 11 may be separated from one another by a distance D2, comprised between 0 and 20 µm. Thus, the optical lens 14 and the distal portion 11a of the light-emitting diode 11 may be tangential or planar punctual mechanical contact, or be distant from one another by a non-zero distance shorter than 20 µm.

Advantageously, the optical lens 14 allows optically transforming the light rays crossing it, so as to generally focus them or improve the directivity thereof by making them as much parallel as possible to one another.

In the rest of the text, the terms «optically transform the light rays» should be broadly understood and comprise in particular the actions of focusing or making substantially parallel or ensuring a collimation or improving the directivity of all or part of the light rays emitted by the light-emitting diode 11 that cross the optical lens 14.

Advantageously, this allows increasing the luminous efficacy of a wire-like shaped three-dimensional light-emitting diode 11 within a determined solid angle as, in the absence of an optical lens 14, a portion of the light emitted by the light-emitting diode 11 is lost because of its emission outside this solid angle.

Several optical lenses 14 may be arranged in series according to the longitudinal axis 11b, for example by combining a spherical first optical lens and a truncated second optical lens superimposed to the first optical lens, for example, so as to make light rays originating from the light-emitting diode 11 parallel thanks to this first optical lens and then focus them using this second optical lens.

The surface of revolution of the optical lens 14 may be shaped so that the surface area of the outer surface, in a section perpendicular to its axis of revolution, has a maximum value at the level of a main plane «P1» substantially parallel to the support face 101a where the section has a maximum diameter D1 larger than or equal to the second transverse dimension 113 of the light-emitting diode 11.

Preferably, the diameter D1 is comprised between 0.1 µm and 100 µm. An optical lens 14 having a diameter D1 as described allows recovering a maximum of light rays originating from a light-emitting diode 11. Advantageously, this allows increasing the luminous efficacy and the overall efficiency.

As illustrated in FIGS. 4 and 5 which represent second and third embodiments, all or part of the space comprised between the portion of the optical lens 14 located opposite the distal portion 11a of the light-emitting diode 11 and the distal portion 11a of the light-emitting diode 11, is filled with an optical material 16 with an optical index comprised between 1.4 and 2.2, more preferably between 1.4 and 2, in any case lower than or equal to the optical index of a material of the optical lens 14.

Throughout the entire text, the terms «optical index» and «refractive index» are equivalent.

For example, the optical material 16 may be formed by SiON or SiN or borosilicate, glass, silica $SiO_2$, $Al_2O_3$, sapphire, polymer, thermoformable polymer, photosensitive resin, or plastic. For example, the optical material 16 may be adapted to be etched isotropically through the implementation of a first etching method. In one example, this first etching method may comprise wet or vapor-phase chemical etching, for example, using hydrofluoric acid HF.

The light-emitting diodes 11 are at least partially surrounded by an encapsulation layer 13. The encapsulation layer 13 may comprise a matrix of an inorganic material, at least partially transparent, within which particles of a dielectric material are possibly scattered. The refractive index of the dielectric material composing the particles is strictly higher than the refractive index of the material composing the matrix. According to one example, the encapsulation layer 13 comprises a layer of silicone, typically of polysiloxane, and further comprises particles of a dielectric material scattered within the matrix. The particles are made of any material type allowing obtaining particles with nanometric dimensions, relatively spherical and having a suitable refractive index. As example, the particles may be made of titanium oxide ($TiO_2$), zirconium oxide ($ZrO_2$), zinc sulfide (ZnS), lead sulfide (PbS) or amorphous silicon (Si). The average diameter of a particle corresponds to the diameter of the sphere having the same volume. Preferably, the average diameter of the particles of the dielectric material is comprised between 2 nm and 250 nm. Preferably, the volume concentration of the particles with respect to the total weight of the encapsulation layer 13 is comprised between 1% and 50%. According to another example, the inorganic material is selected from the group comprising silicon oxides of the type $SiO_x$ where x is a real number strictly greater than 0 and lower than or equal to 2, silicon oxides of the type $SiO_yN_z$ where y is a real number strictly greater than 0 and lower than or equal to 2 and z is strictly greater than 0 and lower than or equal to 0.5, and aluminum oxide ($Al_2O_3$). The encapsulation layer 13 may be made of an organic material that is at least partially transparent. According to one example, the encapsulation layer 13 is made of polyimide. According to another example, the encapsulation layer 13 is made of an epoxide polymer which further comprises particles of a dielectric material scattered within the matrix. The particles may be made of titanium oxide ($TiO_2$), zirconium oxide ($ZrO_2$), zinc sulfide (ZnS), lead sulfide (PbS)) or amorphous silicon (Si). To improve the luminous efficacy of the optoelectronic device 10, a texturing surface treatment may be applied to the encapsulation layer 13. In another example, the encapsulation layer 13 is a resin or a photosensitive resin. In another example, the encapsulation layer 13 contains light converters such as photoluminescent pads or quantum pads. The photoluminescent pads are designed so as to absorb and convert at least one portion of the incident light rays, for example blue-colored, coming from the light-emitting diode 11 and to emit exiting light rays of a different color, for example green or red. Advantageously, these photoluminescent pads may form a wavelength filter as described later on. In one example, the encapsulation layer 13 does not cover the distal portion 11a of the light-emitting diodes 11 and surrounds only their lateral faces that link the proximal portion and the distal portion 11a. Conversely, the encapsulation layer 13 may also covers the distal portion 11a of the light-emitting diodes 11. The thickness of the encapsulation layer 13 considered parallel to the support face 101a from the lateral face of the light-emitting diodes 11 is preferably comprised between 500 nm and 50 µm. In an example illustrated in FIG. 5, the encapsulation layer 13 contains color converters as it allows preventing parasitic wavelengths from being emitted out of the optoelectronic device 10.

The walls 15 adapted to reflect the light rays emitted by the light-emitting diodes may, for example, be substantially parallel to the longitudinal axis 11b of the light-emitting diodes 11 so as to advantageously reflect as much light rays as possible. For example, the walls 15 may be obtained by etching of the encapsulation layer 13 and at least partial filling with a reflective material, such as for example a metal. The walls 15, together with the encapsulation layer 13, allow increasing light extraction towards the optical lens 14. It is still possible to provide for the walls 15 being neither planar nor vertical. Preferably, the walls 15 have a height, considered according to the longitudinal axis 11b from the support face 101a of the substrate 11, larger than the height of the encapsulation layer 13 measured the same way. Thus, a maximum of the light rays emitted by the light-emitting diode 11 could be reflected and/or guided towards the optical lens 14.

As it has already been indicated, the disclosure also concerns a method for manufacturing an optoelectronic device 10, in particular the optoelectronic device 10 as described before.

In general, the method for manufacturing the optoelectronic device 10 comprises the following steps:
a) formation of a substrate 101 delimiting a support face 101a,
b) formation of at least one light-emitting diode 11 having a three-dimensional shape comprising a height along a longitudinal axis 11b extending according to a first direction 112a directed transversely to the support face 101a, and having a first longitudinal dimension 112 considered according to the longitudinal axis 11b between a proximal portion of the light-emitting diode 11 directed towards the support face 101a and a distal portion 11a of the light-emitting diode 11 opposite, along the first direction 112a, to said proximal portion, and at least one second transverse dimension 113 corresponding to a dimension of said three-dimensional shape considered perpendicularly to the longitudinal axis 11b.

Each of the first longitudinal dimension 112 and the second transverse dimension 113 is smaller than or equal to substantially 20 µm.

The manufacturing method also comprises a step i) of forming at least one optical lens 14 on top of the distal portion 11a of the light-emitting diode 11 according to the first direction 112a at a location such that the optical lens 14 is generally axially aligned with the longitudinal axis 11b of the light-emitting diode 11, the formed optical lens 14 being adapted to transform the light rays emitted by the light-emitting diode 11 that cross the optical lens 14 and having an outer surface adapted to be crossed by said light rays having a convex shape.

FIGS. 6 to 11 and 14 represent the steps of a first example of the manufacturing method.

To form the optical lens 14, the manufacturing method may comprise the following steps:

c) formation of an encapsulation layer 13 surrounding all or part of the light-emitting diode 11. The encapsulation layer 13 as well as the distal portion 11a of the light-emitting diode 11 may also be optionally flattened and clipped through a mechanical-chemical polishing step;

d) formation, on the exposed face of the intermediate structure obtained after the step of forming the encapsulation layer 13, of a first layer of an optical material 16 with an optical index comprised between 1.4 and 2.2 and lower than or equal to the optical index of the optical lens 14. This first optical material layer 16 is adapted to be isotropically etched through the implementation of first etching method as described before. The thickness of the optical material layer 16 is comprised between 1 and 50 μm;

e) formation, on the exposed surface of the intermediate structure obtained after the step of forming the first optical material layer 16, of a hard mask layer 17 adapted to not be etched by the implementation of the first etching method. This difference in behavior with regards to the first etching method with respect to the optical material layer 16 advantageously allows obtaining an overhanging structure. Preferably, the hard mask layer 17 as a thickness comprised between 50 nm and 5 μm. The hard mask layer 17 may for example be made of SiN, SiON or SiOCH, f) etching of a first opening 171, through the implementation of a second etching method, through the hard mask layer 17 obtained at step e), the first opening 171 having dimensions and shapes substantially identical to those of a section of the light-emitting diode 11 according to a plane parallel to the support face 101a, the first opening 171 of the hard mask layer 17 being located on top of the light-emitting diode 11 in the continuation of the longitudinal axis 11b. For example, the second etching method is of reactive ion etching «RIE» type or of the plasma etching type;

g) etching of at least one cavity 19, through the implementation of the first etching method at the level of the first opening 171 obtained at step f), across all or part of the thickness of the first optical material layer 16, the cavity 19 obtained in this manner having a concave shape complementary to the convex surface of the optical lens 14 and being suited for the subsequent formation of the optical lens 14 at step i), directly in the cavity 19;

h) removal of the hard mask layer 17.

For example, this step h) may be carried out by mechanical-chemical polishing or using a selective wet-chemistry.

Part of the previously-described step i) includes arranging the optical lens 14 in the concave cavity 19. By «arrangement», it should be understood the «formation in situ» or the «formation ex situ with placement».

In one example, steps a), b) and i) are successive with or without other intermediate steps.

In a second example illustrated in FIGS. 12 and 13, the optical lens 14 is formed in-situ thanks to the implementation of the successive following three substeps:

a first substep i1) including forming a polymer layer 18 over a free surface obtained after the hard mask layer 17 has been removed, the polymer layer 18 filling at least partially the concave cavity 19; to obtain a lens 14 having at least one spherical portion, the cavity 19 is preferably filled with the polymer layer 18;

a second substep i2) including etching a portion to be removed 22 of the polymer layer 18, leaving at least one residual portion 20 of the polymer layer 18 limited right above the etched portion of the first optical material layer 16;

a third substep i3) including annealing the polymer residual portion 20 where the annealing temperature may be comprised between 100 and 300° C., advantageously, the annealing enables the polymer to pass through a viscous phase so as to advantageously obtain a spherical or curved shape by surface tension forces.

In a third example of the manufacturing method illustrated in FIG. 15, the latter comprises an additional step j) which includes forming at least one reflective wall 15, for example by etching of the encapsulation layer 13 and by an at least partial filling with metal. Any other technique known to those skilled in the art may be used. Advantageously, the wall 15 extends from the support face 101a of the substrate 101 and substantially parallel to the longitudinal axis 11b. Advantageously, the walls 15 surrounding the light-emitting diode 11 allows increasing the luminous efficacy by simple or multiple reflections towards the optical lens 14 of the light rays emitted by the light-emitting diode 11. Preferably, the distance between the light-emitting diode 11 and the walls 15 is larger than or equal to 500 nm.

The invention claimed is:

1. An optoelectronic device comprising: a substrate delimiting a support face and at least one light-emitting diode formed on the support face, said at least one light-emitting diode having a three-dimensional shape comprising a height according to a longitudinal axis extending according to a first direction directed transversely to the support face and having a first longitudinal dimension considered according to the longitudinal axis between a proximal portion of the light-emitting diode directed towards the support face and a distal portion of the light-emitting diode opposite, along the first direction, to said proximal portion, and at least one second transverse dimension corresponding to a dimension of said three-dimensional shape considered perpendicularly to the longitudinal axis, wherein each of the first longitudinal dimension and the second transverse dimension is smaller than or equal to about 20 μm, the optoelectronic device includes an optical lens adapted to transform the light rays emitted by the light-emitting diode that cross said optical lens, said optical lens being formed above the distal portion of the light-emitting diode according to the first direction and having an optical axis generally axially aligned with the longitudinal axis of the light-emitting diode and having an outer surface facing the distal portion of said light-emitting diode, adapted to be crossed by at least one portion of said light rays to be transformed, said outer surface having a convex shape.

2. The optoelectronic device according to claim 1, wherein the convex shape of the outer surface of the optical lens is in the form of a surface of revolution whose axis of revolution is substantially aligned with the longitudinal axis of the light-emitting diode and whose generatrix is an arcuate segment.

3. The optoelectronic device according to claim 2, wherein the surface of revolution has a section, viewed in any sectional plane including the axis of revolution, having a horseshoe arch shape.

4. The optoelectronic device according to claim 2, wherein the surface of revolution features the shape of all or part of a sphere.

5. The optoelectronic device according to claim 2, wherein the surface of revolution is shaped so that the surface area of the section of the outer surface in a section perpendicularly to its axis of revolution has a maximum value at the level of a main plane substantially parallel to the support face where the section has a maximum diameter larger than or equal to the second transverse dimension of the light-emitting diode above which the optical lens having said maximum diameter is formed.

6. The optoelectronic device according to claim 5, wherein the maximum diameter is comprised between 0.1 μm and 20 μm.

7. The optoelectronic device according to claim 1, wherein the optical lens is made of a material having a refractive index comprised between 1.4 and 2.2.

8. The optoelectronic device according to claim 1, wherein on a side opposite to the distal portion of the light-emitting diode according to the first direction, the optical lens is truncated according to a plane substantially parallel to the support face.

9. The optoelectronic device according to claim 1, wherein at least one portion of the light-emitting diode comprises a passivation layer.

10. The optoelectronic device according to claim 1, wherein the optical lens and the distal portion of the light-emitting diode are in mechanical contact.

11. The optoelectronic device according to claim 1, wherein at least one portion of the optical lens and the distal portion of the light-emitting diode are separated from one another with interposition of a distance comprised between 5 nm and 20 μm.

12. The optoelectronic device according to claim 1, wherein an optical material, with a refractive index comprised between 1.4 and 2.2 and lower than or equal to a refractive index of the optical lens, fills all or part of the space comprised between the distal portion of the light-emitting diode and the portion of the optical lens turned towards the distal portion of the light-emitting diode.

13. The optoelectronic device according to claim 1, wherein all or part of the light-emitting diode is surrounded by an encapsulation material.

14. The optoelectronic device according to claim 13, wherein, when viewed perpendicularly to the longitudinal axis, the encapsulation material is surrounded by at least one wall adapted to reflect the light rays emitted by the light-emitting diode.

15. A manufacturing method for manufacturing an optoelectronic device, the method including the following successive steps:
   a) formation of a substrate delimiting a support face,
   b) formation of at least one light-emitting diode having a three-dimensional shape comprising a height according to a longitudinal axis extending according to a first direction directed transversely to the support face and having a first longitudinal dimension considered according to the longitudinal axis between a proximal portion of the light-emitting diode directed towards the support face and a distal portion of the light-emitting diode opposite, along the first direction, to said proximal portion, and at least one second transverse dimension corresponding to a dimension of said three-dimensional shape considered perpendicularly to the longitudinal axis, wherein each of the first longitudinal dimension and the second transverse dimension is smaller than or equal to substantially 20 μm, and
   i) formation of one optical lens above the distal portion of the light-emitting diode according to the first direction so that the optical axis of the optical lens is generally axially aligned with the longitudinal axis of the light-emitting diode, the formed optical lens being adapted to transform the light rays emitted by the light-emitting diode that cross the optical lens and having an outer surface facing the distal portion of said light-emitting diode, adapted to be crossed by said light rays to be transformed, said outer surface having a convex shape.

16. The manufacturing method according to claim 15, including the following steps, implemented between step b) and step i):
   c) formation of an encapsulation material surrounding all or part of the light-emitting diode,
   d) formation, over the exposed face of the intermediate structure obtained at step c), of a first layer of an optical material, with a refractive index comprised between 1.4 and 2.2 and lower than or equal to a refractive index of the optical lens, said first optical material layer being adapted to be etched isotropically through the implementation of a first etching method,
   e) formation, over the free surface of the intermediate structure obtained after step d), of a hard mask layer adapted to not be etched during the use of the first etching method,
   f) etching of a first opening, through the implementation of a second etching method, through the hard mask layer obtained at step e), the first opening corresponding to a section of the light-emitting diode according to a plane parallel to the support face, said first opening of the hard mask layer being located above the light-emitting diode in the continuation of the longitudinal axis,
   g) etching of at least one cavity, through the implementation of the first etching method at the level of the first opening obtained at step f), across all or part of the thickness of the first optical material layer, the cavity obtained in this manner having a concave shape complementary to the convex surface of the optical lens and being suited for the subsequent formation of the optical lens at step i) directly in the cavity, and
   h) removal of the hard mask layer.

17. The manufacturing method according to claim 16, wherein step i) includes the following steps:
   i1) formation of a polymer layer over the exposed surface of the intermediate structure obtained after step h), the polymer layer filling all or part of the cavity,
   i2) etching of the polymer layer located at the level of at least one portion to be removed, allowing preserving at least one residual portion of the polymer layer located right above the light-emitting diode in the continuation of the longitudinal axis, and
   i3) annealing of said at least one residual portion, annealing being carried out in conditions allowing making the polymer constituting said at least one residual portion pass through a viscous state.

18. The manufacturing method according to claim 15, including a step j) of forming at least one wall adapted to reflect the light radiations emitted by the light-emitting diode, the wall extending from the support face substantially parallel to the longitudinal axis.

* * * * *